(12) United States Patent
Kitazume

(10) Patent No.: US 7,984,996 B2
(45) Date of Patent: Jul. 26, 2011

(54) DUSTPROOF PANEL

(75) Inventor: Takafusa Kitazume, Osaka (JP)

(73) Assignee: Panasonic Corporation, Osaka (JP)

( * ) Notice: Subject to any disclaimer, the term of this patent is extended or adjusted under 35 U.S.C. 154(b) by 343 days.

(21) Appl. No.: 12/423,311

(22) Filed: Apr. 14, 2009

(65) Prior Publication Data
US 2009/0262423 A1    Oct. 22, 2009

(30) Foreign Application Priority Data
Apr. 16, 2008  (JP) ................... 2008-106273

(51) Int. Cl.
*G02B 1/00*     (2006.01)

(52) U.S. Cl. ........................................ 359/507

(58) Field of Classification Search .......... 359/507, 359/601, 609
See application file for complete search history.

(56) References Cited

U.S. PATENT DOCUMENTS
5,797,570 A * 8/1998 Dolan et al. .......... 359/609
2002/0176170 A1* 11/2002 Huang ................. 359/609
2006/0232915 A1* 10/2006 Chou et al. ........... 361/681

FOREIGN PATENT DOCUMENTS
JP    6-22872    6/1994
* cited by examiner

Primary Examiner — Euncha P Cherry
(74) Attorney, Agent, or Firm — Steptoe & Johnson LLP

(57) ABSTRACT

The dustproof panel includes: (a) a dustproof plate, which has a size covering a screen and extending to a frame member, and whose portion opposing the screen has transparent properties; (b) a frame-shaped dustproof filter formed by attaching a foam body having shrinking properties and containing pores finer than dust particles to a rear surface of the dustproof plate, the attachment being made without gaps therebetween in a frame shape along the edge of the dustproof plate, and the foam body abutting against the frame member; and (c) an attachment/detachment body having a first constituent element attached to the rear surface of the dustproof plate along an inner circumference of the frame-shaped dustproof filter and a second constituent element attached to a front surface of the frame member so as to oppose the first constituent element, the first constituent element and the second constituent element being mutually attachable and detachable.

3 Claims, 3 Drawing Sheets

DUSTPROOF PANEL

BACKGROUND OF THE INVENTION

1. Field of the Invention

The present invention relates to a dustproof panel which prevents dust from adhering to an image display apparatus, such as a cathode ray tube (CRT) or liquid crystal display panel, and more particularly, to a dustproof panel having fewer constituent components, which can be attached and detached by means of a simple installation structure.

2. Description of the Related Art

Conventionally, in an image display apparatus such as a CRT or liquid crystal display monitor, static electricity is liable to occur on the screen and dust is liable to adhere to the screen. When dust adheres to the screen, the screen becomes soiled by the dust and becomes difficult to view. Moreover, when the dust adhering to the screen is wiped away, fine scratches may be produced on the screen. Therefore, when an image display apparatus is used in a location where there is a large amount of dust, the screen is covered with a dustproof panel in order to prevent the adherence of dust to the screen.

For example, in the video industry, images are frequently captured outdoors. Furthermore, in order to check the captured video images, an image display apparatus may be used outdoors. If an image display apparatus is used in a highly dusty location, such as outdoors, without protecting the screen, then the screen is liable to be scratched by dust adhering to the screen. Consequently, in the case of an image display apparatus which is taken outdoors, it is necessary to protect the screen with a dustproof panel in order to avoid the adherence of dust to the screen. Similarly, in an image display apparatus which is incorporated into an apparatus that is used in a highly dusty location, the screen must be protected with a dustproof panel.

Here, an industrial control apparatus is described as one example of an apparatus which is used in a highly dusty location (see, for example, —Japanese Utility Model No. 6-22872).

FIG. 4 is a cross-sectional diagram showing a sectional view of a conventional industrial control apparatus. As shown in FIG. 4, the industrial control apparatus 1 is a console which serves as a man-machine interface. An image display apparatus 30 is disposed inside a steel frame 20, and a dustproof panel 10 is installed on the front face of the frame 20 so as to cover the front face of the screen 40. In order to prevent the adherence of dust to the screen 40, the image display apparatus 30 is sealed by the dustproof panel 10 and the frame 20.

The dustproof panel 10 comprises a dustproof plate 11 and a gasket 12. The gasket 12 is installed in state of tight contact along the edge of the dustproof plate 11 on the rear face of the dustproof plate 11. The dustproof plate 11 is disposed so as to oppose the screen 40. The dustproof plate 11 and the gasket 12 are screw fastened tightly to a frame section 21 which is positioned on the front face of the frame 20, in such a manner that it can be removed easily.

Here, the dustproof plate 11 is a transparent member made of an acrylic resin, for example. The gasket 12 consists of a rigid rubber sponge member having a quadrilateral frame shape or four bar-shaped rigid rubber sponge members which are arranged in a quadrilateral frame shape.

However, with the dustproof panel 10 described above, visibility is impaired due to polarized light caused by the dustproof plate 11. For this reason, when the apparatus is used outdoors where dustproofing is necessary, the dustproof panel 10 is attached to the frame 20 in order to prevent the adherence of dust to the screen 40, whereas when the apparatus is used indoors where dustproofing is not necessary, the dustproof panel 10 may be removed from the frame 20 in order to make the screen 40 easier to view.

SUMMARY OF THE INVENTION

The present invention was devised in view of the aforementioned problem, an object thereof being to provide a dustproof panel which is attachable and detachable by means of a simple installation structure which comprises a small number of constituent components.

In order to achieve the aforementioned objects, the dustproof panel according to the present invention is: (a) a dustproof panel, attachable and detachable to and from a frame member that surrounds a screen of an image display apparatus, for preventing dust from adhering to the screen, comprising: (b) a dustproof plate which has a size covering the screen and extending to the frame member, and whose portion opposing the screen has transparent properties; (c) a frame-shaped dustproof filter formed by attaching a foam body having shrinking properties and containing pores finer than dust particles to the rear surface of the dustproof plate, the attachment being made without gaps therebetween in a frame shape along the edge of the dustproof plate, and the foam body abutting against the frame member; and (d) an attachment/detachment body having a first constituent element attached to the rear surface of the dustproof plate along the inner circumference of the frame-shaped dustproof filter and a second constituent element attached to the front surface of the frame member so as to oppose the first constituent element, the first constituent element and the second constituent element being mutually attachable and detachable.

As described above, according to the present invention, it is possible to attach and detach a dustproof panel easily from the front surface of the screen of an image display apparatus, by means of the attachment/detachment body. In particular, by using surface fasteners for the attachment/detachment body, it is possible to achieve a simple composition which involves a small number of constituent parts.

The present invention relates to a dustproof panel which prevents dust from adhering to an image display apparatus, such as a CRT or liquid crystal display panel, and more particularly, it can be used as a dustproof panel having a small number of constituent components, which can be attached and detached by means of a simple installation structure.

DESCRIPTION OF THE PREFERRED EMBODIMENTS

Embodiment

Below, an embodiment of the present invention will be described.

Figure 1:
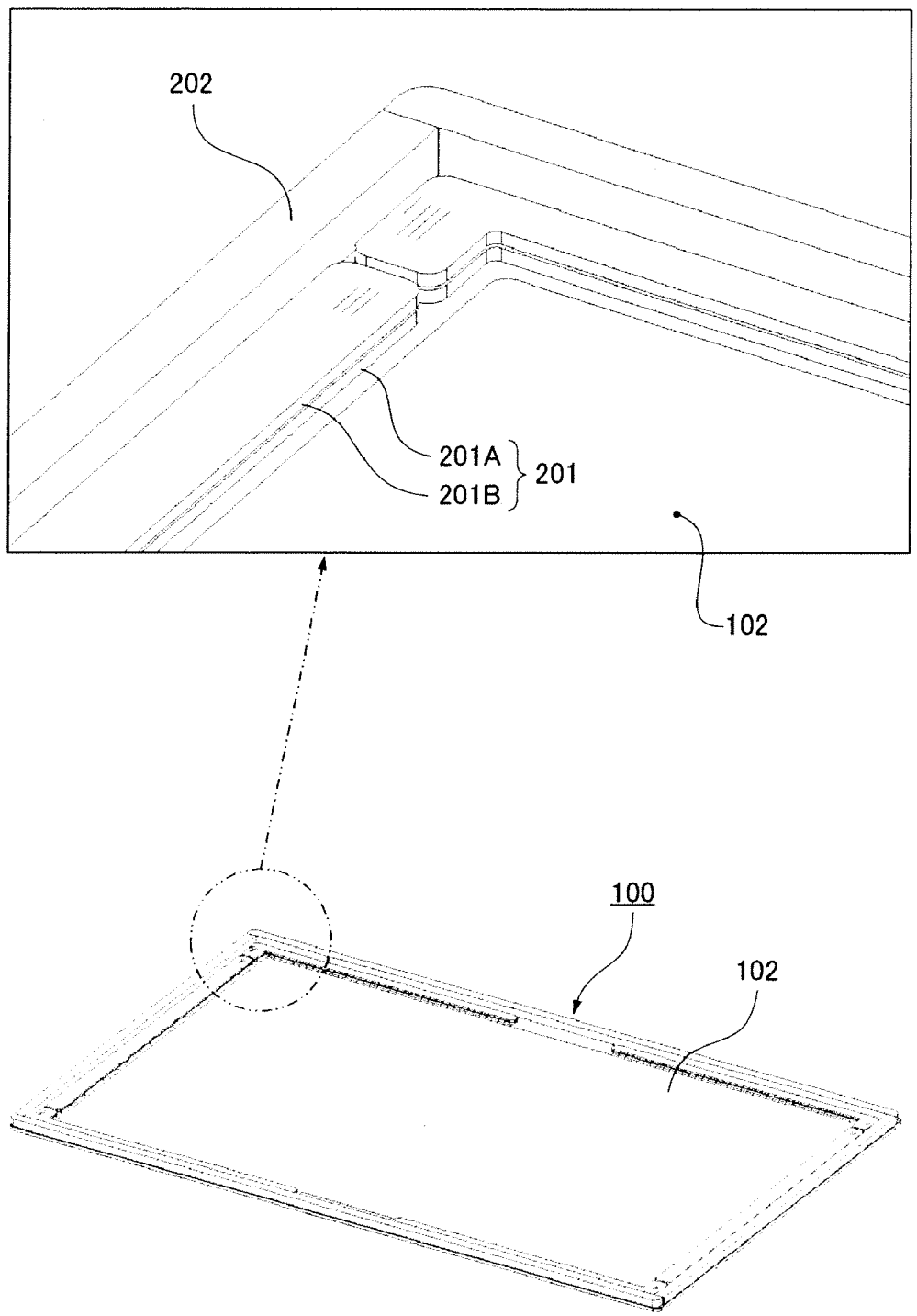
FIG. 1 shows a perspective diagram depicting a rear face side of a dustproof panel according to an embodiment, and an partial enlarged diagram showing one portion of the same.
Figure 2:
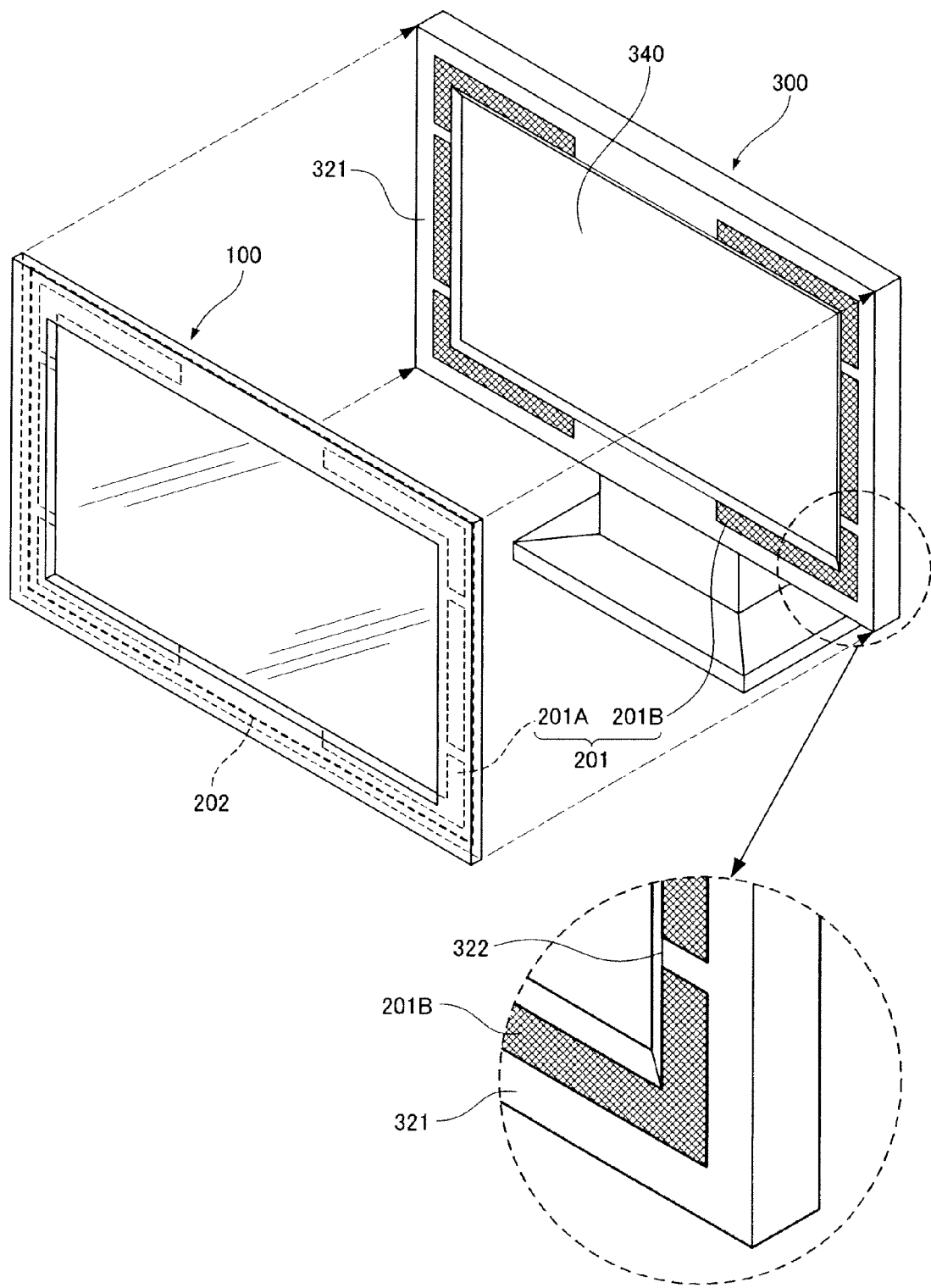
FIG. 2 is an installation diagram showing a state of installing the dustproof panel according to the embodiment of an image display apparatus.
Figure 3:
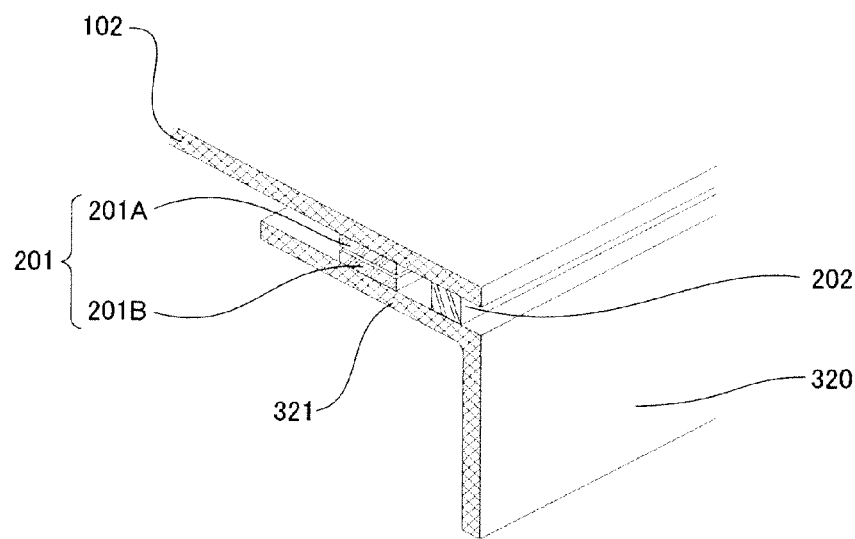
FIG. 3 is a cross-sectional diagram showing a cross-section of an installation location when the dustproof panel according to the embodiment is installed on the image display apparatus.
Figure 4:
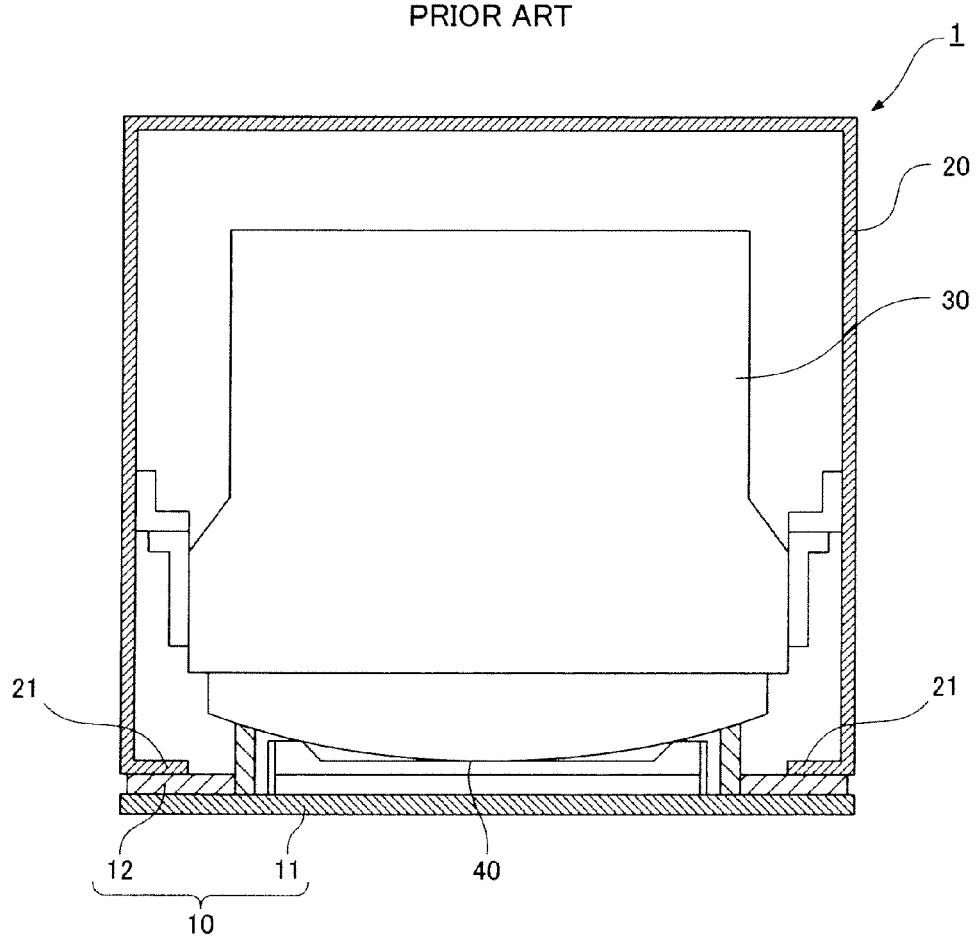
FIG. 4 is a cross-sectional diagram showing a sectional view of a conventional industrial control apparatus.

FIG. 1 shows a perspective diagram depicting the rear face side of a dustproof panel according to the present embodiment, and a partial enlarged diagram showing one portion of same. FIG. 2 is an installation diagram showing a state of installing a dustproof panel according to the present embodiment on an image display apparatus. FIG. 3 is a cross-sectional diagram showing a cross-section of an installation location when the dustproof panel according to the present embodiment is installed on a frame.

(Dustproof Panel 100)

As shown in FIG. 1, the dustproof panel 100 comprises a dustproof plate 102, a frame-shaped dustproof filter 202 and an attachment/detachment body 201. Here, an example is described in which the dustproof panel 100 is attached directly to the image display apparatus 300, as shown in FIG. 2.

(Dustproof Plate 102)

The dustproof plate 102 has a square shape and is of a size which covers the screen 340 and extends to the frame member 321 surrounding the screen 340; the portion opposing the screen 340 is a plate which is transparent. For example, it is a rectangular acrylic resin plate or glass plate, or the like. An acrylic resin plate is particularly suitable, since it is light in weight, transmits the light of the screen 340 well, and does not break even if it receives impacts of varying degrees of force.

(Frame-Shaped Dustproof Filter 202)

The frame-shaped dustproof filter 202 is constituted by a foam body having shrinking properties and pores finer than dust particles, which is attached in a frame shape to the rear surface of the dustproof plate 102 along the edge of the dustproof plate 102, without any gaps. Furthermore, as shown in FIG. 1, the foam body has a greater thickness than the attachment/detachment body 201 and abuts against the frame member 321 when attached along the edge of the dustproof plate 102. When the dustproof panel 100 is attached to the image display apparatus 300, as shown in FIG. 3, the frame-shaped dustproof filter 202 is pressed and compressed by the dustproof plate 102 and the frame member 321, and the frame-shaped dustproof filter 202 thus makes tight contact with the frame member 321. By this means, it is possible to prevent dust from entering in between the dustproof panel 100 and the screen 340, by means of the frame-shaped dustproof filter 202.

The material of the frame-shaped dustproof filter 202 may be, for example, a foam body made of a resin having a high degree of foaming, a foam body made of synthetic rubber having a high degree of foaming, a foam body containing a resin having a high degree of foaming and a synthetic rubber having a high degree of foaming, or the like. A foam body made of a synthetic rubber, such as EPDM (ethylene propylene diene monomer), is especially desirable. Furthermore, desirably, the expansion ratio of the foam body is approximately ten to fifteen times. Apart from this, as the material of the frame-shaped dustproof filter 202, it is also possible to use a foam body containing a polyolefin resin, such as PE (polyethylene), and synthetic rubber. Furthermore, the expansion ratio of the foam body does not have to be restricted to approximately ten to fifteen times.

(Attachment/Detachment Body 201)

The attachment/detachment body 201 enables the dustproof plate 102 to be attached to and detached from the image display apparatus 300. Here, for example, it is constituted as a surface fastener having a first constituent element 201A and a second constituent element 201B which can be mutually attached and detached. The first constituent element 201A is attached to the rear surface of the dustproof plate 102 along the inner circumference of the frame-shaped dustproof filter 202. The second constituent element 201B is attached to the front surface of the frame member 321, so as to oppose the first constituent element 201A. When the dustproof panel 100 is installed on the image display apparatus 300, the first constituent element 201A and the second constituent element 201B make tight contact with each other. By this means, the dustproof panel 100 is fixed to the front of the screen 340.

The attachment/detachment body 201 may also be constituted by separable adhesive tape, or the like, rather than a surface fastener. Furthermore, if the frame member 321 is made of synthetic resin, then the attachment/detachment body 201 may be formed by a combination of a magnetic sheet and a steel sheet. Furthermore, if the frame member 321 is made of steel, then it is possible to use a magnetic sheet only.

As shown in FIG. 2, the attachment/detachment body 201 may also be constituted by four L-shaped portions and two bar-shaped portions. In this case, as to the L-shaped portions and the bar-shaped portions, parts of the second constituent element 201B are disposed so as to coincide with the edge 322 of the frame member 321. Moreover, as to the L-shaped portions, parts of the second constituent element 201B may be attached by making the angle of the part coincide with the angle of the edge 322. By this means, it is simple to locate the second constituent element 201B in position.

(Summary)

Above, according to the present embodiment, it is possible to attach and detach the dustproof panel 100 to and from the image display apparatus 300 readily by means of the attachment/detachment body 201. In particular, by using surface fasteners for the attachment/detachment body 201, it is possible to achieve a simple composition which involves a small number of constituent parts.

Furthermore, dust is shut out by the frame-shaped dustproof filter 202, and dust does not enter in between the dustproof panel 100 and the screen 340. For this reason, it is possible to prevent dust from adhering to the screen 340. Moreover, since the attachment/detachment body 201 is positioned on the inner side of the frame-shaped dustproof filter 202, then it is possible to prevent dust from adhering to the attachment/detachment body 201 as well.

By this means, in an outdoors location which is highly dusty, it is possible to prevent the adherence of dust to the screen 340 by attaching a dustproof panel 100 to the image display apparatus 300. In an indoors location where there is little dust, the screen 340 can be made more readily visible by removing the dustproof panel 100 from the image display apparatus 300.

Modification Example

Instead of the dustproof panel 10, it is also possible to attach a dustproof panel 100 to a conventional industrial control apparatus 1. In this case, the second constituent element 201B are attached to a frame member 21 of the frame 20.

What is claimed is:

1. A dustproof panel, attachable and detachable to and from a frame member surrounding a screen of an image display apparatus, for preventing dust from adhering to the screen, comprising:
- a dustproof plate having a size covering the screen and extending to the frame member, a portion the dustproof plate that opposes the screen having transparent properties;
- a frame-shaped dustproof filter formed by attaching a foam body, having shrinking properties and containing pores finer than dust particles, to a rear surface of the dustproof plate, the attachment being made without gaps therebetween in a frame shape along an edge of the dustproof plate, and the foam body abutting against the frame member; and
- an attachment/detachment body having a first constituent element attached to the rear surface of the dustproof plate along an inner circumference of the frame-shaped dustproof filter and a second constituent element attached to a front surface of the frame member so as to oppose the first constituent element, the first constituent element and the second constituent element being mutually attachable and detachable.

2. The dustproof panel according to claim 1, wherein the attachment/detachment body is a surface fastener.

3. The dustproof panel according to claim 1, wherein the frame-shaped dustproof filter is one of a foam body formed of synthetic rubber, a foam body made of resin, and a foam body containing resin and synthetic rubber.

* * * * *